(12) United States Patent
Dickey et al.

(10) Patent No.: US 12,082,334 B2
(45) Date of Patent: Sep. 3, 2024

(54) DEVICES AND METHODS TO IMPROVE THERMAL CONDUCTION FROM SMT AND CHIP ON BOARD COMPONENTS TO CHASSIS HEAT SINKING

(71) Applicant: Hamilton Sundstrand Corporation, Charlotte, NC (US)

(72) Inventors: John Dickey, Caledonia, IL (US); Kevin Kilroy, Gilbert, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 1 day.

(21) Appl. No.: 17/720,685

(22) Filed: Apr. 14, 2022

(65) Prior Publication Data
US 2023/0337353 A1  Oct. 19, 2023

(51) Int. Cl.
| H05K 1/02 | (2006.01) |
|---|---|
| H05K 1/09 | (2006.01) |
| H05K 1/18 | (2006.01) |
| H05K 3/10 | (2006.01) |

(52) U.S. Cl.
CPC ........... *H05K 1/0207* (2013.01); *H05K 1/021* (2013.01); *H05K 1/09* (2013.01); *H05K 1/181* (2013.01); *H05K 3/107* (2013.01); *H05K 2201/0302* (2013.01); *H05K 2201/032* (2013.01); *H05K 2201/10166* (2013.01)

(58) Field of Classification Search
CPC .......... H05K 1/181; H05K 1/09; H05K 1/021; H05K 1/0207; H05K 3/107; H05K 2201/0302; H05K 2201/032; H05K 2201/10166
See application file for complete search history.

(56) References Cited

U.S. PATENT DOCUMENTS

| 4,010,435 A * | 3/1977 | Shigehara | ................ H01F 5/04 336/192 |
|---|---|---|---|
| 4,658,091 A * | 4/1987 | McCarthy | ............ H01F 27/027 174/545 |
| 5,075,759 A | 12/1991 | Moline | |
| 5,412,538 A * | 5/1995 | Kikinis | ................ H05K 1/182 174/262 |

(Continued)

FOREIGN PATENT DOCUMENTS

DE   112018006054 T5   8/2020

OTHER PUBLICATIONS

Extended European Search Report issued of the European Patent Office, dated Aug. 31, 2023, in corresponding European Patent Application No. 23167737.8.

*Primary Examiner* — William H. Mayo, III
*Assistant Examiner* — Rhadames Alonzo Miller

(57) ABSTRACT

Circuit board assemblies include a circuit board portion having a recess formed therein, an electrically and thermally conductive insert, shaped to fit in the recess formed in the circuit board portion, an electrically and thermally conductive layer adapted and configured to interface with an external chassis, and a thermally conductive electrically insulative portion interposed between the electrically and thermally conductive insert and the electrically and thermally conductive layer, adapted and configured to conduct heat from the electrically and thermally conductive insert to the electrically and thermally conductive layer without conducting electricity.

20 Claims, 3 Drawing Sheets

(56) References Cited

U.S. PATENT DOCUMENTS

| | | | | |
|---|---|---|---|---|
| 5,504,653 A * | 4/1996 | Murphy | H01L 23/4093 | 361/704 |
| 5,581,443 A * | 12/1996 | Nakamura | H01L 23/585 | 257/E23.09 |
| 5,621,636 A * | 4/1997 | Tanigawa | H01F 19/04 | 363/147 |
| 6,297,721 B1 * | 10/2001 | Lu | H01R 13/6633 | 336/229 |
| 6,320,489 B1 * | 11/2001 | Lu | H01R 13/7193 | 336/229 |
| 7,064,957 B1 * | 6/2006 | Liang | H05K 7/20545 | 361/709 |
| 7,358,189 B2 | 4/2008 | Yamamoto et al. | | |
| 8,836,459 B1 * | 9/2014 | Hsu | H01F 27/022 | 336/212 |
| 9,788,430 B1 * | 10/2017 | Folker | H01F 27/06 | |
| 9,980,396 B1 * | 5/2018 | Folker | H01F 27/006 | |
| 2003/0057550 A1 * | 3/2003 | Zhao | H01L 23/49833 | 257/734 |
| 2003/0116671 A1 * | 6/2003 | Okamoto | H01F 27/29 | 242/437.2 |
| 2003/0201462 A1 * | 10/2003 | Pommer | G02B 6/4259 | 257/200 |
| 2004/0100164 A1 * | 5/2004 | Murata | H03H 9/1085 | 310/348 |
| 2007/0015416 A1 * | 1/2007 | Gutierrez | H01R 24/64 | 439/676 |
| 2007/0086175 A1 * | 4/2007 | Davis | H05K 7/186 | 361/802 |
| 2007/0093086 A1 * | 4/2007 | Davis | H05K 1/14 | 439/76.1 |
| 2008/0042250 A1 * | 2/2008 | Wilson | H01L 23/66 | 257/E25.023 |
| 2008/0115967 A1 * | 5/2008 | Giboney | H05K 9/0056 | 174/351 |
| 2008/0254688 A1 * | 10/2008 | Bogursky | H01R 43/16 | 29/874 |
| 2009/0051004 A1 * | 2/2009 | Roth | H01L 23/49816 | 438/106 |
| 2009/0103302 A1 | 4/2009 | Lin et al. | | |
| 2011/0109400 A1 * | 5/2011 | Koga | H03H 9/0576 | 333/186 |
| 2011/0115593 A1 * | 5/2011 | Liao | H01F 27/306 | 29/605 |
| 2011/0140263 A1 * | 6/2011 | Camacho | H01L 23/49548 | 257/E23.141 |
| 2011/0248389 A1 * | 10/2011 | Yorita | H01L 25/0652 | 257/659 |
| 2011/0254156 A1 * | 10/2011 | Lin | H01L 21/6835 | 257/737 |
| 2011/0255850 A1 * | 10/2011 | Dinh | B41F 17/00 | 396/176 |
| 2012/0099288 A1 * | 4/2012 | Parish | H05K 1/145 | 29/832 |
| 2012/0326292 A1 * | 12/2012 | Ohashi | H01L 23/3677 | 257/690 |
| 2014/0233188 A1 * | 8/2014 | Terasawa | H01L 23/049 | 361/748 |
| 2015/0195956 A1 * | 7/2015 | Linderman | H05K 1/181 | 363/141 |
| 2015/0287672 A1 * | 10/2015 | Yazdani | H01L 23/49827 | 257/774 |
| 2016/0366765 A1 * | 12/2016 | Martinez | H05K 3/301 | |
| 2017/0196090 A1 * | 7/2017 | Kummerl | H05K 1/181 | |
| 2018/0062618 A1 * | 3/2018 | Nagarkar | H03H 9/1085 | |
| 2018/0068782 A1 * | 3/2018 | Afsharian | H01F 27/29 | |
| 2018/0368293 A1 * | 12/2018 | Bultitude | H10N 10/17 | |
| 2019/0244747 A1 * | 8/2019 | Yan | H01F 27/2876 | |
| 2019/0383481 A1 | 12/2019 | Song | | |
| 2020/0116802 A1 * | 4/2020 | Matsuoka | G01R 33/0283 | |
| 2020/0161274 A1 | 5/2020 | Lee | | |
| 2020/0229303 A1 | 7/2020 | Yeh et al. | | |
| 2021/0105891 A1 * | 4/2021 | Uchida | H05K 7/205 | |
| 2022/0183140 A1 * | 6/2022 | Uchida | H05K 1/0204 | |

\* cited by examiner

DEVICES AND METHODS TO IMPROVE THERMAL CONDUCTION FROM SMT AND CHIP ON BOARD COMPONENTS TO CHASSIS HEAT SINKING

BACKGROUND OF THE INVENTION

The thermal dissipation limits for circuit boards are often a major limiting design factor. In cases when such boards carry power semiconductors, thermal dissipation is even more critical. In many applications, circuit boards are carried by a chassis which functions as structural support, electrical ground and an important part of the pathway for thermal dissipation for one or more circuit boards.

Advancing technologies permit fabrication of components with smaller physical sizes, which can then be placed onto boards closer together, while newer chip-on-board ("COB") designs, have semiconductors and power semiconductors mounted to bare copper of a board. This newer process eliminates the semiconductor package, and as a result it is not possible to mount such components so that they are coupled directly to a heat sink, which presents a substantial obstacle to removing large amounts of heat from components directly through dedicated heat sinks. Older through-hole style devices can be mounted to vertical heat sinks with electrical leads passing through the PCB to make electrical contact, while the back side of the device package conducts heat to the vertical heat sink, which leverages more surface area to dissipate the heat into the surrounding air. Such a configuration is not feasible with dense COB designs.

Moreover, traditional PCB assemblies use stacked up layers of copper and insulator material such as FR4, a fiberglass-epoxy composite. The copper conducts heat very well but when the heat has to be passed from one piece of copper to another to maintain voltage isolation the FR4 in between results in a very high thermal resistance—on the order of 1000 times that of an equivalent shape of copper. Traditionally a multilayer board was made from multiple 2 layer boards, each starting with laminated copper on both sides and then etched down to create isolated copper areas and traces as needed. This approach can only result with the original insulator material such as FR4 left between the copper layers since it started out completely laminated on both sides by copper. Due to geometry ratios of the areas of copper compared to its thickness the best way to couple heat has been vertically from the broad side of one copper layer through the insulator material to the broad side of another copper layer. Such a configuration results in a lot of surface area for heat conduction and a short transit path. Yet even with this arrangement the thermal drop between the pieces of copper is very significant and is the limiting factor for the entire structure.

Further complicating potential thermal dissipation schemes, almost all chassis externally have to be grounded for safety so any internal power voltages on circuit boards housed therein have to be electrically isolated from the chassis. This combination of factors results in no good way to get the heat from where it is generated by semiconductor devices to its supporting chassis in order to be dissipated into the surrounding air, for example.

Design and performance are therefore seriously limited by how much heat can be dissipated by a circuit board, as compared with what would otherwise be technically achievable. Applicants recognize that there is a need in the art for improved designs that increase thermal dissipation capabilities of semiconductors. The devices and related methods of the present disclosure provide solutions for this need.

SUMMARY OF THE INVENTION

In accordance with the present invention, devices and methods are provided that enhance the thermal performance of circuit boards—particularly those in dense configurations and housed in a chassis or otherwise in contact with a heat sink.

In accordance with one aspect of the present invention a circuit board assembly is provided that includes a circuit board portion having a recess formed therein, an electrically and thermally conductive insert, shaped to fit in the recess formed in the circuit board portion, an electrically and thermally conductive layer adapted and configured to interface with an external chassis, and a thermally conductive electrically insulative portion interposed between the electrically and thermally conductive insert and the electrically and thermally conductive layer, adapted and configured to conduct heat from the electrically and thermally conductive insert to the electrically and thermally conductive layer without conducting electricity.

The circuit board assembly can further include one or more semiconductor circuit elements mounted thereto, such as a MOSFET. The circuit board portion can be formed from a composite material, such as, but not limited to FR4. The circuit board portion can have one or more circuit traces formed thereon. The circuit traces can be provided in one or multiple layers. The thermally conductive electrically insulative portion can be a continuous region of material. Alternatively, the thermally conductive electrically insulative portion can include discontinuous regions of thermally conductive electrically insulative material dispersed within a layer of circuit board material, or other suitable material. Circuit board assemblies in accordance with the invention can further include a second electrically and thermally conductive insert, shaped to fit in a second recess formed in the circuit board portion. Similarly, third and subsequent inserts can be provided, as required.

In accordance with a further aspect of the invention, a method of forming a circuit board assembly is provided, which includes forming a recess in a circuit board portion, forming an electrically and thermally conductive insert, shaped to fit in the recess of the circuit board portion, placing the insert in the recess, forming an electrically and thermally conductive layer adapted and configured to interface with an external chassis, forming a thermally conductive electrically insulative portion, interposing the thermally conductive electrically insulative portion between the electrically and thermally conductive insert and the electrically and thermally conductive layer, and bonding the layers together.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail hereinbelow with reference to certain figures, wherein.

DETAILED DESCRIPTION OF THE INVENTION

Figure 1:
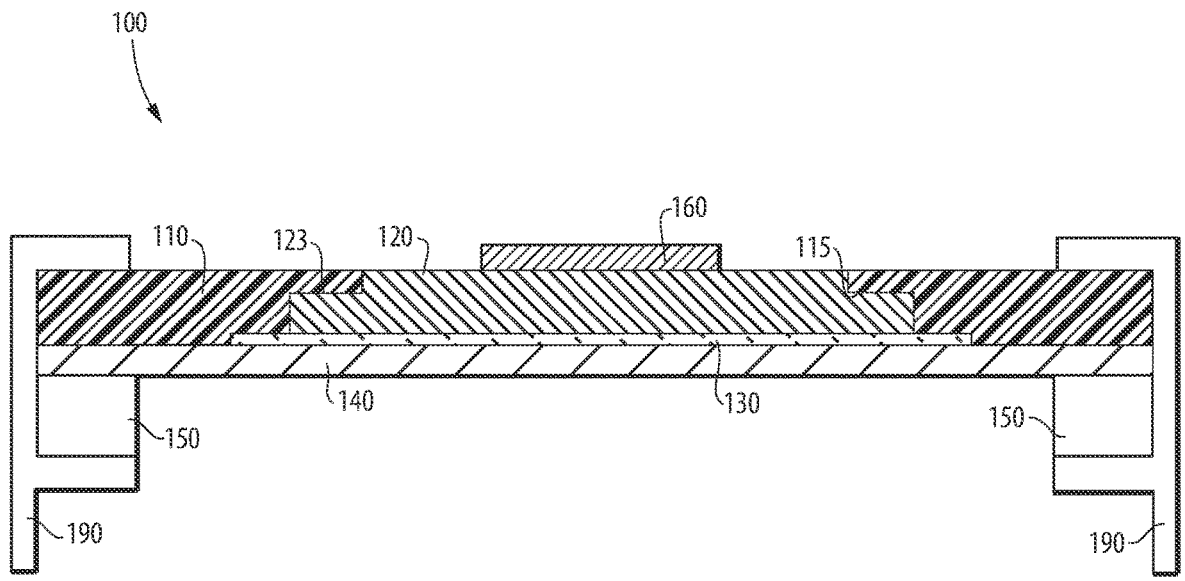
FIG. 1 is a cross-sectional view of a PCB assembly in accordance with a first embodiment of the present invention.

Reference will now be made to the drawings wherein like reference numerals identify similar structural features or aspects of the subject disclosure.

The devices and related methods of the present invention benefit from aspects of newer construction techniques for thick copper boards where copper pieces are milled and inlayed into a PCB material. In accordance with the invention, copper elements are assembled as separate pieces, instead of being etched down from copper clad laminate. Applicants have recognized, therefore, an opportunity to embed a high thermal conductivity electrical insulator material between thick copper layers and thereby to dramatically improve thermal conduction. In this manner, devices in accordance with the invention benefit from effective thermal conduction from electrically live layers through thermal pads and into chassis ground layers, that in-turn can carry it off to a chassis and/or heat sink areas.

Devices in accordance with the invention have the potential to reduce temperature drop between copper layers by many times, thus dramatically reducing the temperature of COB and other SMT parts. As a result, higher currents can be controlled in the same board area and higher density of components can be achieved, due to a need for less surface area to couple the heat into surrounding air.

Now that the copper can be reliably milled or otherwise shaped as a separate piece and then assembled into a PCB as an inlay there is the opportunity to introduce a thermally conductive electrical insulator (TCEI) material between layers of copper. In accordance with the invention, such material can be selected from materials typically used as thermally conductive, electrical isolative materials.

Turning now to the figures and with reference to FIG. 1, there is illustrated a cross-sectional view of a PCB assembly in accordance with a first embodiment of a circuit board assembly of the present invention, and which is designated generally by reference numeral 100. The PCB assembly 100 is illustrated being held in an external chassis 190 by wedgelocks 150. The PCB assembly includes a circuit board portion 110, which typically will have one or more circuit traces formed thereon, and may include multiple layers of composite circuit board material and electrical traces, although in the embodiment of FIG. 1, one layer is shown.

In this instance, a recess 115 is formed in the circuit board portion to hold a correspondingly shaped insert 120. The recess 115 may be formed in any suitable manner, including molding the shape at the time of manufacture of the material of the circuit board portion 110, or by a later machining or milling step, for example.

The insert 120 is preferably electrically and thermally conductive to meet the requirements of applications of the assembly 100, and is preferably formed of solid metallic copper, although if desired, other materials can be used, including but not limited to silver, or aluminum, for example depending on the electrical, thermal and structural requirements of the particular implementation. As illustrated in FIG. 1, the insert 120 can be provided with an upper face having a step 123 to engage with a complementary profile of the recess 115 of the circuit board portion 110. In this manner, the circuit board portion 110 fully captures the insert 120, thereby improving structural integrity of the overall assembly 100.

The assembly 100 is illustrated with a semiconductor 160 mounted on the insert. Naturally, depending on the desired application, the full configuration of the insert (or inserts) 120 will be as needed, determined by the function and configuration of the semiconductor 160. For instance, a power MOSFET will have at least two high-current carrying legs (source and drain), and a gate—each of which will require external connections, which can be accomplished by respective inserts 120.

Further, an electrically and thermally conductive base layer 140 is provided in the assembly 100, and is adapted and configured to interface with the external chassis 190 directly or by way of any ancillary fixing components such as the wedgelocks 150. It is this base 140 that conducts heat away from heat generating components (e.g. semiconductor 160) to the chassis for dissipation. The base extends at least from central areas of the board where heat is generated toward outer edges of the board where heat is dissipated to the chassis. The material for the base 140 is preferably highly thermally conductive, such as metallic copper, but other suitable materials can be used.

Interposed between the base 140 and the insert 120 is a thermally conductive electrically insulative portion 130, which can be a layer or a portion of a layer, depending on the mechanical characteristics of the material from which the thermally conductive electrically insulative portion 130 is formed. As illustrated in FIG. 1, the thermally conductive electrically insulative portion 130 preferably extends at least some distance beyond the extents of the insert 120 so as to provide a good voltage barrier between the electrically live insert 120 and the base 140, which is typically grounded to the chassis 190.

In accordance with the invention, the thermally conductive electrically insulative portion 130 is formed from any suitable material, such thermal gap pads, or materials such as those that are typically used at an interface of semiconductor devices and heat sinks for example. Other suitable material options include but are not limited to mica, aluminum nitride, beryllium oxide, boron nitride, alumina, and diamond, for example.

Figure 2:
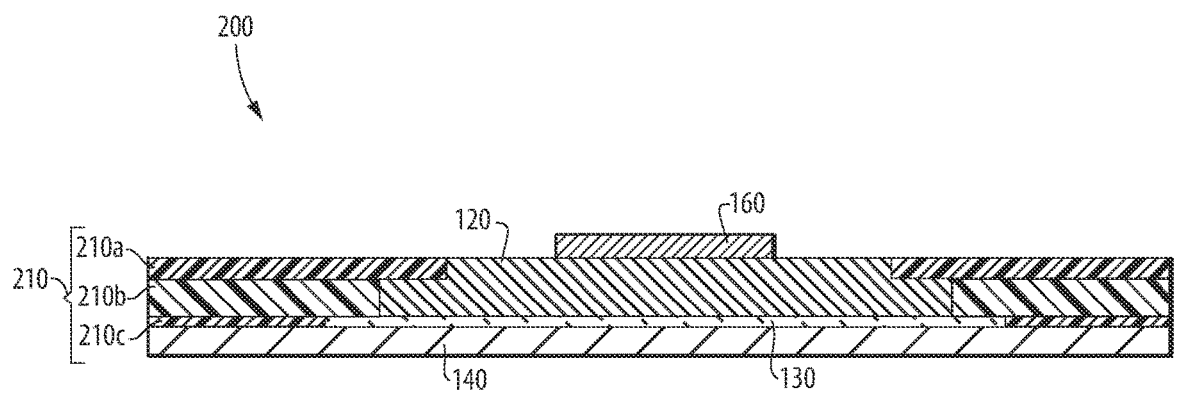
FIG. 2 is a cross-sectional view of a PCB assembly in accordance with a second embodiment of the present invention.

FIG. 2 is a cross-sectional view of a PCB assembly 200 in accordance with a second embodiment of the present invention, which is similar to the PCB assembly 100 of FIG. 1, but in which the circuit board portion 210 is formed from multiple laminated layers 210a, 210b, 210c. These layers and other layers described in connection with this and other embodiments can be laminated by any suitable technique, such as but not limited to adhesive and heat-bonding techniques. If desired, depending on the particular application, more or fewer layers can be provided.

Figure 3:
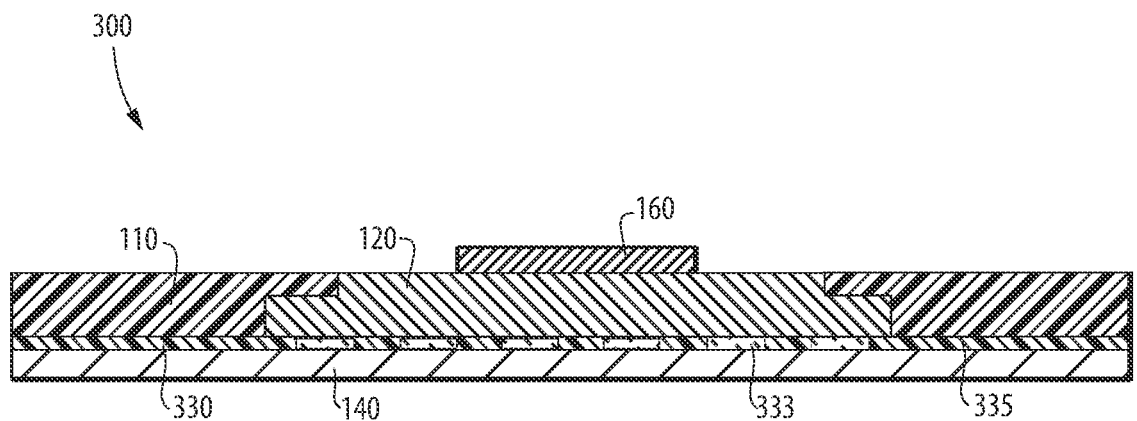
FIG. 3 is a cross-sectional view of a PCB assembly in accordance with a third embodiment of the present invention.

FIG. 3 is a cross-sectional view of a PCB assembly 300 in accordance with a third embodiment of the present invention, which is similar to the PCB assembly 100 of FIG. 1 and PCB assembly 200 of FIG. 2, but differs in the form and construction of the thermally conductive electrically insulative layer 330. As shown in FIG. 3 and in the plan view of FIG. 4, the main body 335 of layer 330 is formed from one material, for example any standard PCB material like FR4 glass-epoxy composite, while a separate, thermally conductive electrically insulative material is provided in select regions 333. As such, the layer 330 and indeed the overall assembly 300 benefit from the structural strength and dimensional stability of a first material, while still providing areas for enhanced thermal conductivity of a second material. Because the layers 110, 330 and 140 are laminated together, the precise mechanical characteristics of the thermally conductive material in regions 333 are not necessarily of great importance.

Regions 333 can be formed in the body 335 of layer 330 by any suitable means, including but not limited to molding at the time of fabrication, or by punching, milling or otherwise machining of the material after fabrication thereof. Naturally, the precise shape of the regions 333 can vary as required or desired to enhance thermal and/or physical performance of the layer. Although substantially circular regions 333 are illustrated, other forms, such as substantially rectangular regions can be provided without departing from the spirit or scope of the invention.

Figure 4:
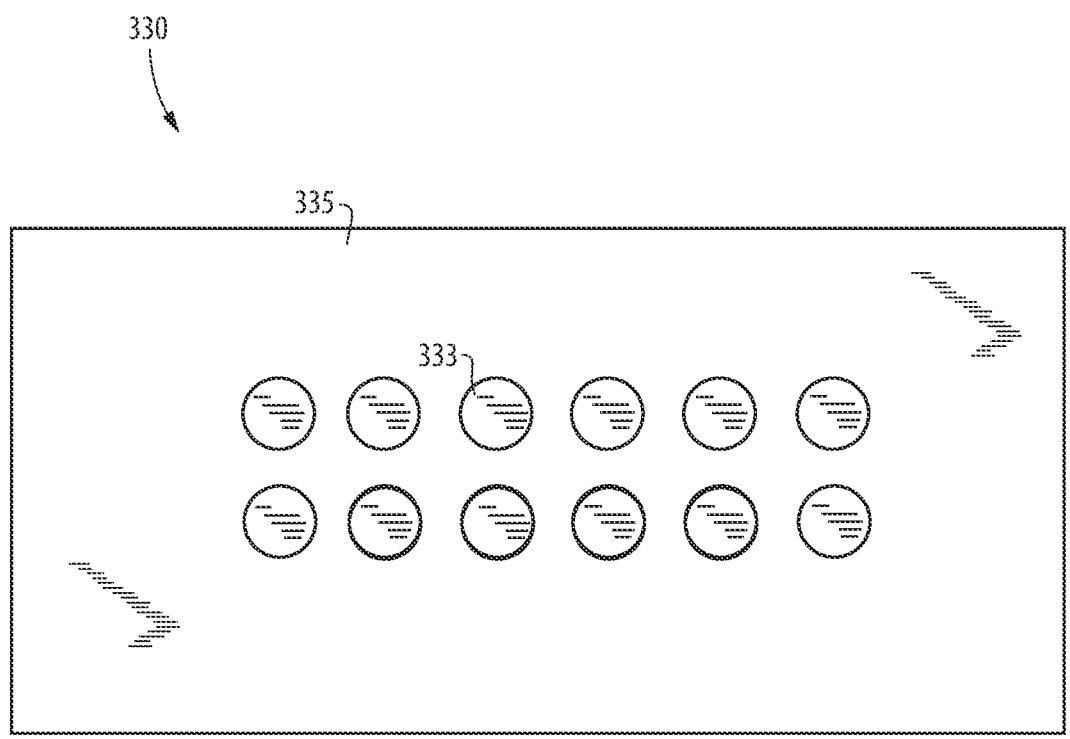
FIG. 4 a plan view of a thermally conductive electrically insulative layer of the third embodiment of the present invention.

One further benefit of the configuration of the layer 330 of FIGS. 3 & 4 is that retaining PCB material in between regions 333 can allow for vias (circuit connections) through those regions to other layers. It is noted, also, that many layers can be provided, as desired, but only two layers are illustrated in FIG. 3 for the sake of clarity.

Figure 5:
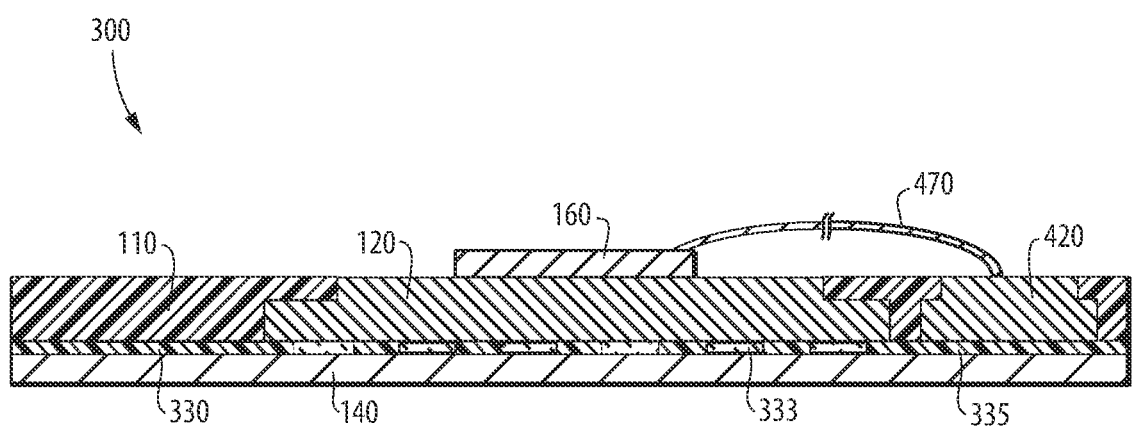
FIG. 5 is a cross-sectional view of a PCB assembly in accordance with a fourth embodiment of the present invention.

FIG. 5 is a cross-sectional view of a PCB assembly 500 in accordance with a fourth embodiment of the present invention. The assembly 500 is illustrated with a semiconductor 160 mounted on the insert. As mentioned above, depending on the desired application, the number and configuration of the insert(s)—in this case a first insert 120 and second insert 420—is as needed, determined by the function and configuration of the semiconductor 160. In the illustration of FIG. 5, this exemplary embodiment shows a bond wire 470 connecting the semiconductor 160 to a second insert 420, and thus also to a second electrical and thermal conduction pathway. Additional bonds can be formed to third, fourth and subsequent pathways as needed. Although not specifically illustrated in this embodiment, the thermally conductive regions 333 can extend under the second insert 420 to enhance thermal performance.

It will be apparent to those skilled in the art that variations of the precise configuration and implementation of devices and the related methods of the present invention can be made without departing from the spirit or scope of the invention. Various geometries of assemblies and their constituent components can be applied, while yielding a reliable assembly benefitting from improved thermal conduction path between semiconductors, including power semiconductors, and a chassis or heat sink. Moreover, the present invention results in a flat surface of the PCB assembly, such that current assembly techniques will still work without substantial modification, if any.

With the application of high thermal conductivity materials between the copper layers, the heat conduction can go up dramatically, allowing much more heat to be dissipated than before, resulting in lower component temperatures. The better thermal conduction allows for much more power dissipation to be used in the same size board area than historically possible, allowing for higher power densities and/or higher circuit counts since they can be packed closer together and still dissipate generated heat.

What is claimed is:

1. A circuit board assembly comprising:
   a circuit board portion having a stepped recess formed therein;
   an electrically and thermally conductive insert, shaped to fit in the recess formed in the circuit board portion;
   an electrically and thermally conductive layer adapted and configured to interface with an external chassis; and
   a thermally conductive electrically insulative portion interposed between the electrically and thermally conductive insert and the electrically and thermally conductive layer, adapted and configured to conduct heat from the electrically and thermally conductive insert to the electrically and thermally conductive layer without conducting electricity.

2. The circuit board assembly of claim 1, further comprising one or more semiconductor circuit elements mounted thereto.

3. The circuit board assembly of claim 1, wherein the circuit board portion is formed from a composite material.

4. The circuit board assembly of claim 1, wherein the circuit board portion has one or more circuit traces formed thereon.

5. The circuit board assembly of claim 1, wherein the thermally conductive electrically insulative portion is a continuous region of material.

6. The circuit board assembly of claim 1, wherein the thermally conductive electrically insulative portion includes discontinuous regions of thermally conductive electrically insulative material distributed across a layer of circuit board material.

7. The circuit board assembly of claim 1, further comprising:
   a second electrically and thermally conductive insert, shaped to fit in a second recess formed in the circuit board portion.

8. The circuit board assembly of claim 1, wherein the electrically and thermally conductive insert is formed from copper.

9. The circuit board assembly of claim 1, wherein the electrically and thermally conductive layer is formed from aluminum.

10. The circuit board assembly of claim 1, wherein the stepped recess includes a ledge formed within the circuit board portion adapted and configured to mechanically retain the electrically and thermally conductive insert.

11. The circuit board assembly of claim 1, wherein the stepped recess includes a narrow portion and a wide portion, such that a wide portion of the electrically and thermally conductive insert cannot pass through the narrow portion of the stepped recess.

12. The circuit board assembly of claim 1, wherein the electrically and thermally conductive layer adapted and configured to interface with the external chassis is a flat layer, adapted and configured to conduct heat laterally, away from a heat-generating element toward a supporting structure.

13. A method of forming a circuit board assembly comprising:
   forming a stepped recess in a circuit board portion;
   forming an electrically and thermally conductive insert, shaped to fit in the recess of the circuit board portion;
   placing the insert in the recess;
   forming an electrically and thermally conductive layer adapted and configured to interface with an external chassis;
   forming a thermally conductive electrically insulative portion; and
   interposing the thermally conductive electrically insulative portion between the electrically and thermally conductive insert and the electrically and thermally conductive layer.

14. A circuit board assembly comprising:
   a circuit board portion having a recess formed therein;

an electrically and thermally conductive insert, shaped to fit in the recess formed in the circuit board portion;

an electrically and thermally conductive layer adapted and configured to interface with an external chassis; and a thermally conductive electrically insulative portion interposed between the electrically and thermally conductive insert and the electrically and thermally conductive layer, adapted and configured to conduct heat from the electrically and thermally conductive insert to the electrically and thermally conductive layer without conducting electricity, wherein the circuit board portion, the electrically and thermally conductive insert, the electrically and thermally conductive layer and the thermally conductive electrically insulative portion are each fully in contact with adjacent layers.

15. The circuit board assembly of claim 14, wherein the thermally conductive electrically insulative portion is a continuous region of material.

16. The circuit board assembly of claim 14, wherein the thermally conductive electrically insulative portion includes discontinuous regions of thermally conductive electrically insulative material distributed across a layer of circuit board material.

17. The circuit board assembly of claim 14, further comprising:

a second electrically and thermally conductive insert, shaped to fit in a second recess formed in the circuit board portion.

18. The circuit board assembly of claim 14, wherein the electrically and thermally conductive insert is formed from copper.

19. The circuit board assembly of claim 14, wherein the recessed is stepped and includes a ledge formed within the circuit board portion adapted and configured to mechanically retain the electrically and thermally conductive insert.

20. The circuit board assembly of claim 14, wherein the electrically and thermally conductive layer adapted and configured to interface with the external chassis is a flat layer, adapted and configured to conduct heat laterally, away from a heat-generating element toward a supporting structure.

* * * * *